(12) United States Patent
Chen et al.

(10) Patent No.: US 6,433,725 B1
(45) Date of Patent: Aug. 13, 2002

(54) HIGH SPEED ANALOG-TO-DIGITAL CONVERTER

(75) Inventors: Dongwei Chen, San Gabriel; Massimo Antonio Sivilotti, Sierra Madre, both of CA (US)

(73) Assignee: Turner Research, Inc., Pasadena, CA (US)

( * ) Notice: Subject to any disclaimer, the term of this patent is extended or adjusted under 35 U.S.C. 154(b) by 26 days.

(21) Appl. No.: 09/722,917

(22) Filed: Nov. 27, 2000

(51) Int. Cl.[7] ................................................ H03M 1/12
(52) U.S. Cl. ....................................... 341/155; 341/160
(58) Field of Search ................................. 341/155, 158, 341/159, 160, 94, 60, 64, 118; 340/347

(56) References Cited

U.S. PATENT DOCUMENTS

| | | | |
|---|---|---|---|
| 4,733,220 A | * 3/1988 | Knierim | 340/347 |
| 5,382,955 A | * 1/1995 | Knierim | 341/64 |
| 5,644,312 A | * 7/1997 | Deevy et al. | 341/159 |

OTHER PUBLICATIONS

New Encoding Scheme For High–Speed Flash ADC's by F. Kaess, R. Kanan, B. Hochet and M. Declercq of Electronics Lab., Swiss Federal Institute of Technology, published in the 1997 IEEE International Symposium on Circuits and Systems, Jun. 9–12 1997, Hong Kong.*

* cited by examiner

Primary Examiner—Peguy Jeanpierre
Assistant Examiner—Joseph Lauture
(74) Attorney, Agent, or Firm—Stout, Uka Buyan +Mullins, LLP

(57) ABSTRACT

A method of converting a thermometer code in an analog-to-digital converter to a binary code. The method involves counting the ones in the thermometer code and using the parity of the count as bit 0 of the binary code; downsampling the thermometer code by dropping every other bit to form a downsampled code; counting the ones in the downsampled code, and using the parity of that count as bit 1 of the binary code; and repeating the procedure until the binary code is completed. A circuit carrying out this method in a single clock cycle without computations is disclosed.

6 Claims, 1 Drawing Sheet

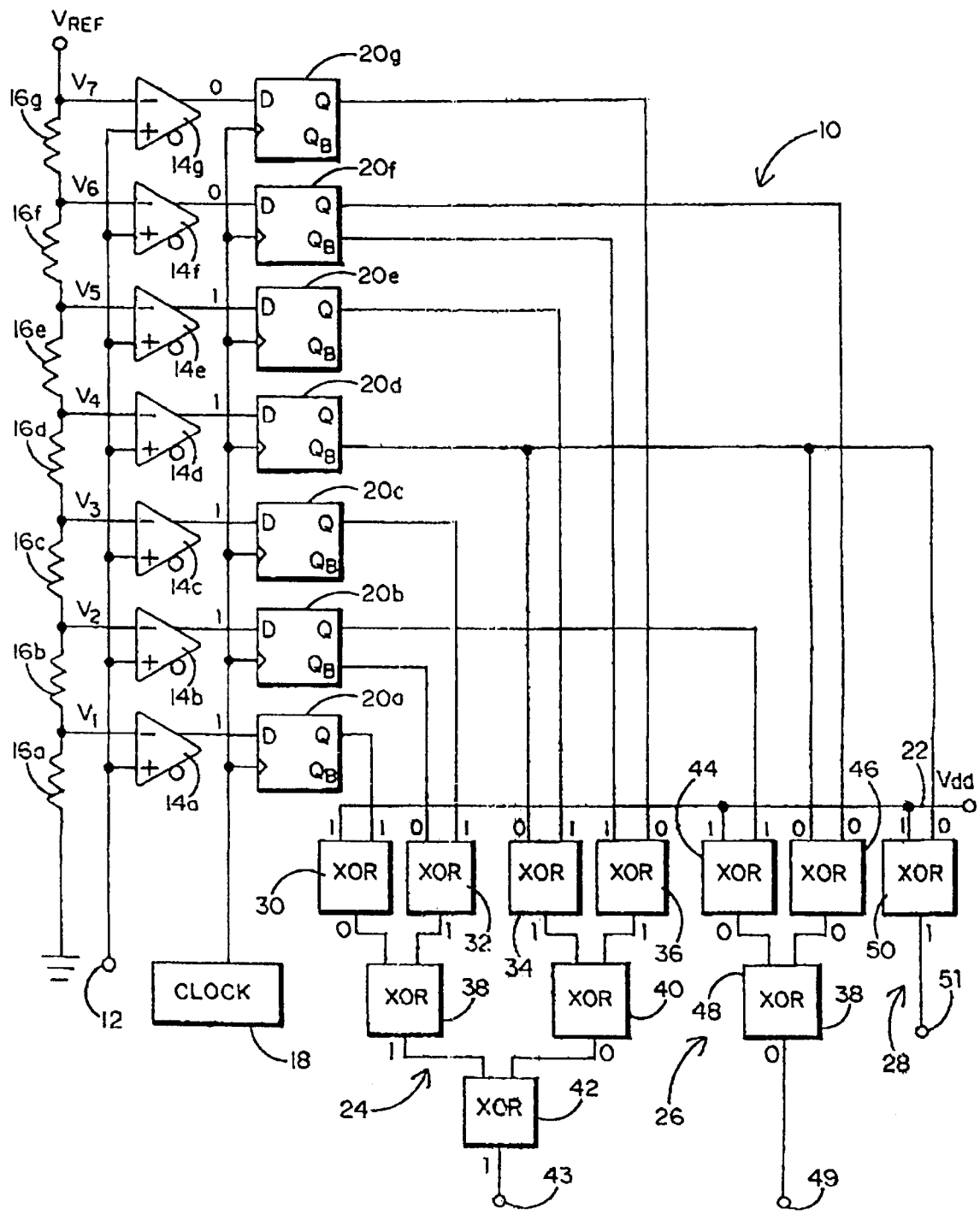

HIGH SPEED ANALOG-TO-DIGITAL CONVERTER

FIELD OF THE INVENTION

This invention relates to a method and apparatus which converts a thermometer code in an analog-to-digital converter into a binary code by using the parities of the sums of thermometer code bits in selected sets of bit positions as the bits of the binary code.

BACKGROUND OF THE INVENTION

Analog-to-digital conversion is a basic procedure in communications and in every other field in which a physical quantity must be expressed in a binary code that can be processed by computers or microprocessors. The typical architectures for realizing high speed analog-to-digital converters (ADCs) are flash ADCs, interpolating and folding ADCs, two-step ADCs and pipelined ADCs. In these ADCs, a thermometer encoder is used to convert thermometer code to binary code.

Typically, a physical quantity such as the voltage value of an analog signal at any given moment of sampling is applied in parallel to a group of comparators that compare the signal to a set of equally spaced reference voltage levels. Typically, comparators associated with a reference level higher than the signal voltage put out a logic 0, while the comparators associated with a reference level lower than the signal voltage put out a logic 1. The comparator set thus translates the instantaneous signal voltage into a coded sample of the form 0 . . . 000111 . . . 1. This type of code is known as a thermometer code. In order to be usable by digital equipment, this thermometer code must be translated into a binary code in which the bits represent successive powers of 2.

Accurate real-time conversion of the thermometer code into binary code presents a number of problems. One such problem is the occurrence of bubbles, i.e. a false 0 or 1 in the thermometer code, such as 0 . . . 001011 . . . 1. Typically, a bubble is very small and affects only one thermometer digit very close to the boundary between the 0s and the 1s. Nevertheless, the position of the bubble is critical in conventional conversion schemes, so that under certain circumstances, a small bubble can cause a disproportionately large error. Another problem is time. With the demand for ever higher sampling rates, conversion schemes which involve computational steps or intermediate conversions become undesirable. Finally, circuit simplicity and power requirements are crucial in many specialty applications.

Conventional conversion schemes are illustrated in U.S. Pat. No. 4,733,220 to Knierim, in which an intermediate gray code is used to minimize the effect of the bubble errors; U.S. Pat. No. 5,382,955 to Knierim, which divides the thermometer code into subsets for encoding, and then combines the output of the subencoders to create the binary code; and U.S. Pat. No. 5,644,312 to Kenneth, in which a ROM encoder converts thermometer code to gray code, and then converts the gray code to binary code.

SUMMARY OF THE INVENTION

The present invention provides a simple, fast, error-robust thermometer-to-binary code conversion method and apparatus that occupies a very small chip area in integrated circuit devices. The inventive apparatus consumes no static power and very little dynamic power.

The invention accomplishes this by using the parities of the sums of thermometer code bits in selected sets of bit positions in thermometer code to directly form the bits of the binary code without any intermediate conversion.

BRIEF DESCRIPTION OF THE DRAWING

The single FIGURE of the drawing illustrates a simplified exemplary circuit which is suitable for implementing the inventive method in the production of an unsigned binary code.

DESCRIPTION OF THE PREFERRED EMBODIMENT

The algorithm underlying the invention is the following: M reference voltages are generated with a constant voltage difference from one to the next. This voltage difference defines the voltage resolution of the least significant bit (LSB). The analog signal is then compared with these M references to form a thermometer code, where the first bit of the thermometer code is the output of the comparison between the analog input and the lowest reference voltage. Of course, the Mth bit of the thermometer code is the output of the comparison between the analog input and the highest reference voltage. If the analog signal is less than the (i+1)th reference voltage, a one-to-zero transition occurs at the ith bit of the thermometer code.

The bit j of the corresponding N-bit binary code is determined by the parity of the number of logic true (i.e. logic 1) state of all the bits located at $k2^j$ positions in the thermometer code, where $j=0,1,2, \ldots ,(N-1)$; $k=1,2, \ldots$; and the bit position for the thermometer code starts from 1 to M. If the parity is odd, then the jth bit is 1; if the parity is even, the jth bit is 0.

In the preferred circuit implementation described herein, a permanently true (i.e. 1) bit is added to the above-described thermometer code after the lowest comparator output bit to form an M+1 thermometer code. This bit is termed bit 0. Now, the bit position for the thermometer code starts from 0 to M. The bit j of the corresponding N-bit binary code is determined by the parity of the number of logic true (i.e. logic 1) state of all the bits located at $k2^j$ positions in the thermometer code, where $j=0,1,2, \ldots ,(N-1)$ and $k=0,1,2, \ldots$ If the parity is even, then the jth bit is 1; if the parity is odd, the jth bit is 0.

Thus, for j=0 in the seven level example with a signal value between levels 5 and 6 as illustrated, which corresponds to a binary code of 101 in the drawing, $k2^j=k$, and the relevant bit positions in the thermometer code are 0, 1, 2, 3, . . . , i.e. all bit positions. Therefore, bit 0 of the binary code will be 1 because there are six 1s in the thermometer code.

For j=1, $k2^j=2k$. Therefore, the relevant bits of the thermometer code are bits 0, 2, 4, . . . , i.e. every other bit position. In the chosen example, there are three ones in those positions; consequently, bit 1 of the binary code is 0.

Finally, for j=2, $k2^j=4k$, and the relevant thermometer code bit positions are 0, 4, . . . There are two is in those positions, and bit 2 of the binary code is 1.

More generally, the inventive algorithm for converting an M-bit thermometer code to an N-bit binary code can be expressed as follows:

1. Let i=the number of ones in the thermometer code. If i is odd, the LSB (bit 0) of the binary code is 1; otherwise it is 0.
2. In determining bit 1 of the binary code, it is assumed that $i=2i_1+LSB$. The M-bit thermometer code can be downsampled to an $M_1$-bit thermometer code by dropping all even-positioned bits. The number of ones in the $M_1$-bit code will be $i_1$. If $i_1$ is odd, bit 1 of the binary code is 1; otherwise, it is 0.

3. For bit 2 of the binary code, it is assumed that $i_1=2i_2+$bit 1. The $M_1$-bit thermometer code is again downsampled to an $M_2$-bit code by dropping all even-positioned bits of the $M_1$-bit code. The number of ones in the $M_2$-bit code will be $i_2$. If $i_2$ is odd, bit 2 of the binary code is 1; otherwise it is 0.

4. The foregoing process is then repeated for binary bits 3 through N−1.

The above-described encoding algorithm is robust to bubble errors in the thermometer code. Usually, a thermometer code has a single transition. However, sometimes a lone 0 may occur within the string of 1s due to metastability, noise, cross talk, limited bandwidth, etc. These bubbles usually occur near the transition point of the thermometer code, such as 000 . . . 00010111 . . . 111 When the bubble 0 is not located at a $2^m$th bit, the bubble only affects the LSB and the error is 1. When the bubble 0 is located at a $2^m$th bit, the bubble inverts the bits that are larger than 0 and less than m+1. The effective error is 2. When the bubble is next to the transition point, the maximum error for a single bubble is 2.

The drawing FIGURE illustrates a simple exemplary circuit 10 using the invention to convert samples of a signal with a maximum amplitude of 7 voltage levels into a three-bit binary code. It will be understood that in practice, a circuit of this type would have $2^n-1$ voltage levels, where n would likely be 8 or more.

The voltage level of the signal 12 is compared by each of the comparators 14a through 14g to a specific reference voltage level.

The reference voltage levels produced by the identical resistors 16a through 16g represent successive equally spaced ones of the seven voltage levels discernible by the circuit 10.

The outputs of the comparators 14a–14g are sampled at predetermined intervals by a sampling clock 18, which transfers their logic values at the sampling time to flip-flops 20a through 20g, respectively. Thus, if the instantaneous voltage level of signal 12 at the sampling time is at least 5 but less than 6, the Q outputs of flip-flops 20a through 20e will be logic 1, while the Q outputs of flip-flops 20f and 20g will be logic 0. This constitutes the thermometer code 00111111, the final 1 of which is the permanent logic 1 appearing on the line 22 that corresponds to a signal level of zero.

In accordance with the present invention, this thermometer code is converted to a binary code (101 in this instance) not by manipulating the digits of the thermometer code, but rather by using, as the bits of the binary code, the parities of the number of 1s in selected sets of bit positions of the thermometer code. For this purpose, the Q and $Q_B$ outputs of the flip-flops 20a–20g are advantageously connected to EXCLUSIVE-OR (XOR) gate trees 24, 26, 28 as shown in the drawing FIGURE. As is well known to persons conversant with digital electronics, an XOR gate puts out a logic 1 if one, but only one, of its inputs is 1; otherwise, it puts out a logic 0.

Therefore, for parity evaluation purposes, the inputs of the input-level XORs 30, 32, 34, 36 of the XOR tree 24 are connected alternately line 22 and then to the Q and $Q_B$ outputs of successive ones of the flip-flops 20a through 20g. The outputs of each pair of the input-level XORs 30, 32, 34, 36 become the inputs of one of the mid-level XORs 38, 40, and the outputs of those become the inputs of the output-level XOR 42. The output of the XOR 42 is the least significant bit (LSB) 43 of the binary code.

Similarly, the inputs of input-level XORs 44, 46 of XOR tree 26 are connected to line 22 and then alternately to the Q and $Q_B$ outputs of every second one (20b, 20d, 20f) of the flip-flops 20a through 20g. The outputs of input-level XORs 44, 46 form the inputs of output-level XOR 48, and the output of XOR 48 is the second bit 49 of the binary code.

Finally, the inputs of the single XOR 50 of XOR tree 28 are connected to line 22 and to the $Q_B$ output of the fourth flip-flop 20d. The output of XOR 50 is the most significant bit (MSB) 51 of the binary code. It will be noted that where an XOR tree contains only one XOR, as is always the case in the MSB tree, the second input of the single XOR must be connected to the $Q_B$ output of the relevant flip-flop, not the Q output as in the other trees.

In the chosen example in which the signal 12 is sampled at a voltage level of at least 5 but less than 6, the small 1s and 0s beside the leads of the XOR trees 24, 26, 28 illustrate the manner in which the XOR trees convert the thermometer code bits into binary bits.

The inventive encoding method is superior to prior art methods because it is fast, requiring only one clock delay when implemented with a pipeline structure as shown; efficient, because it requires no calculations; and error tolerant. It also has low power requirements in its implementations because they consume no static power and very little dynamic power. They can also be implemented in smaller chip areas, which is important in miniaturization.

The described method and embodiment produce an unsigned binary code. A two's complement binary code can be produced, if desired, merely by inverting the MSB of the unsigned binary code. In the preferred embodiment shown in the drawing, this can be done simply by connecting the second input of XOR 50 to the Q output, rather than the $Q_B$ output, of flip-flop 20d.

It will be understood that the circuitry described herein is only one preferred embodiment of the inventive method. Consequently, the invention is not meant to be limited by any specific physical implementation, but only by the scope of the following claims.

We claim:

1. A method of converting a thermometer code into a binary code, comprising the steps of:
    a) establishing a thermometer code whose number of bits is a function of $2^n$, where n is a positive integer;
    b) selecting successive groups of thermometer code bits spaced $2^j$ bits apart, where j is an integer and $0 \leq j < n$;
    c) determining, for each group, the parity of the number of thermometer code bits in that group that have a predetermined logic value; and
    d) using the parities so determined as the bits of the binary code.

2. The method of claim 1, in which said function of $2^n$ is $2^n+1$.

3. The method of claim 2, in which said predetermined logic value is 1.

4. The method of claim 3, in which an odd parity produces a 1 in the binary code, and an even parity produces a 0 in the binary code.

5. A method of converting an analog signal sample into an N-bit binary code representative of the magnitude of said sample, comprising:
    a) using said signal sample to establish an M-bit thermometer code representative of the magnitude of said analog signal sample;
    b) determining i=the number of ones in said M-bit thermometer code;

c) setting bit 0 of said N-bit binary code to 1 if i has a predetermined parity, otherwise to 0;

d) downsampling said M-bit thermometer code to an $M_1$-bit thermometer code by dropping every other bit of said M-bit code;

e) determining $i_1$=the number of ones in said $M_1$-bit thermometer code;

f) setting bit 1 of said N-bit binary code to 1 if $i_1$ has said predetermined parity otherwise to 0; and g) repeating said downsampling, determining and setting steps for bits 2 through N−1 of said binary code.

6. The method of claim 2, in which said predetermined parity is odd.

* * * * *